(12) United States Patent
Parks

(10) Patent No.: US 7,015,520 B1
(45) Date of Patent: Mar. 21, 2006

(54) CHARGE-COUPLED DEVICES HAVING EFFICIENT CHARGE TRANSFER RATES

(75) Inventor: Christopher Parks, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 10/964,101

(22) Filed: Oct. 13, 2004

(51) Int. Cl.
H01L 27/148 (2006.01)
H01L 29/768 (2006.01)

(52) U.S. Cl. .................. 257/246; 257/215; 257/248
(58) Field of Classification Search ............ 257/215, 257/246, 248
See application file for complete search history.

(56) References Cited

U.S. PATENT DOCUMENTS

| | | | | |
|---|---|---|---|---|
| 3,731,197 A | * | 5/1973 | Clark | 380/36 |
| 4,125,786 A | * | 11/1978 | MacLennan | 377/57 |
| 4,132,903 A | * | 1/1979 | Graham | 377/63 |
| 4,810,901 A | * | 3/1989 | Yamada | 327/515 |
| 4,862,487 A | * | 8/1989 | Ando et al. | 377/58 |
| 5,862,197 A | * | 1/1999 | Yoon et al. | 377/61 |
| 6,462,779 B1 | | 10/2002 | Philbrick | |
| 6,586,784 B1 | * | 7/2003 | Parks | 257/236 |
| 2002/0118291 A1 | * | 8/2002 | Ishigami et al. | 348/311 |
| 2005/0062868 A1 | * | 3/2005 | Shiiba et al. | 348/316 |

* cited by examiner

*Primary Examiner*—Tom Thomas
*Assistant Examiner*—Jesse A. Fenty
(74) *Attorney, Agent, or Firm*—Peyton C. Watkins

(57) ABSTRACT

A camera includes a charge-coupled device having a substrate or well of a first conductivity type; a buried channel of a second conductivity type; a dielectric disposed on the substrate; six gates disposed on the dielectric that are space oriented sequentially 1 through 6 in which six gates, in a first mode, receives signals in which alternating gates receive substantially complimentary clock cycles, and in a second mode the gates receive signals in which gates 1 and 4 receive complimentary clock cycles and gates 2 and 5 are approximately held at a first constant voltage and gates 3 and 6 are approximately held at a second constant voltage.

7 Claims, 8 Drawing Sheets

CHARGE-COUPLED DEVICES HAVING EFFICIENT CHARGE TRANSFER RATES

FIELD OF THE INVENTION

The invention relates generally to the field of charge-coupled devices and, more particularly, to such charge-coupled devices in which charges are transferred therefrom at high rates.

BACKGROUND OF THE INVENTION

Referring to FIG. 1, there is shown a prior art charge-coupled device (CCD) as described in U.S. Pat. No. 6,462,779. This patent discloses a CCD 10 that may be either a linear CCD or an area array CCD. The CCD 10 is fabricated on a p-type well or substrate 12. If it is a well, then it may be a p-type well in an n-type substrate, a well-known configuration for interline-type CCD arrays. It also might be the substrate itself if it is a p-type substrate, a common configuration for full-frame or linear type CCD arrays. In the well or substrate 12, there is an n-type buried channel 14 which forms the charge packet 20 carrying layer. The buried channel 14 contains a channel adjustment implant 18 to alter the channel potential under the gates or a portion of the gates H1, H2, and H3. The gates are separated from the buried channel 14 by an electrically insulating gate dielectric 16. The CCD 10 as shown is referred to in the art as pseudo 2-phase architecture. The gates are clocked by three control signals H1, H2, and H3 to move the charge packet 20 through the CCD 10. The H3 signal goes to every other gate, and the gate signal between the H3 gates alternates between H1 and H2. FIG. 2 illustrates the voltages on the gates for normal speed full resolution charge transfer. The H1 and H2 gates are clocked with equal voltages and complimentary to H3. One half-clock cycle from time T0 to time T1 advances the charge packet 20 by one gate as shown in FIG. 1.

By altering the voltages applied to the gates as in FIG. 4 the function of the CCD 10 is altered. In this case, every other gate (H3) is held at a constant voltage while the gates on either side of H3, the H1 and H2 gates, are clocked in a complimentary manner. The result is shown in FIG. 3 where in one half clock cycle from time T0 to time T1 the charge packet 22 advances two gates. This transfers charge through the CCD at double the speed of the FIG. 2. timing.

The prior art is limited to two modes of operation, the first mode being normal speed charge transfer, and the second mode being double speed charge transfer. There are instances when it is desirable to transfer charge at an even faster rate than double speed mode. Such situations arise when it is desired to sum together three adjacent charge packets in a CCD for purposes of reducing the resolution of an image. For example, it is desirable to obtain 640 horizontal pixels at a faster frame rate from an area array that is normally 1920 horizontal pixels. By summing three pixels in a horizontal CCD a triple speed CCD would read out the line three times faster than the prior art.

Consequently, a need exists for a CCD that can read more than the currently available double speed transfer rate.

SUMMARY OF THE INVENTION

The present invention is directed to overcoming one or more of the problems set forth above. Briefly summarized, according to one aspect of the present invention, the invention resides in a charge-coupled device including a substrate or well of a first conductivity type; a buried channel of a second conductivity type; a dielectric disposed on the substrate; six gates disposed on the dielectric that are spatially oriented sequentially 1 through 6 in which six gates, in a first mode, receives signals in which alternating gates receive substantially complimentary clock cycles, and in a second mode the gates receive signals in which gates 1 and 4 receive complimentary clock cycles and gates 2 and 5 are approximately held at a first constant voltage and gates 3 and 6 are approximately held at a second constant voltage.

These and other aspects, objects, features and advantages of the present invention will be more clearly understood and appreciated from a review of the following detailed description of the preferred embodiments and appended claims, and by reference to the accompanying drawings.

Advantageous Effect Of The Invention

The present invention has the advantage of producing high transfer rates in CCDs.

DETAILED DESCRIPTION OF THE INVENTION

Figure 1:
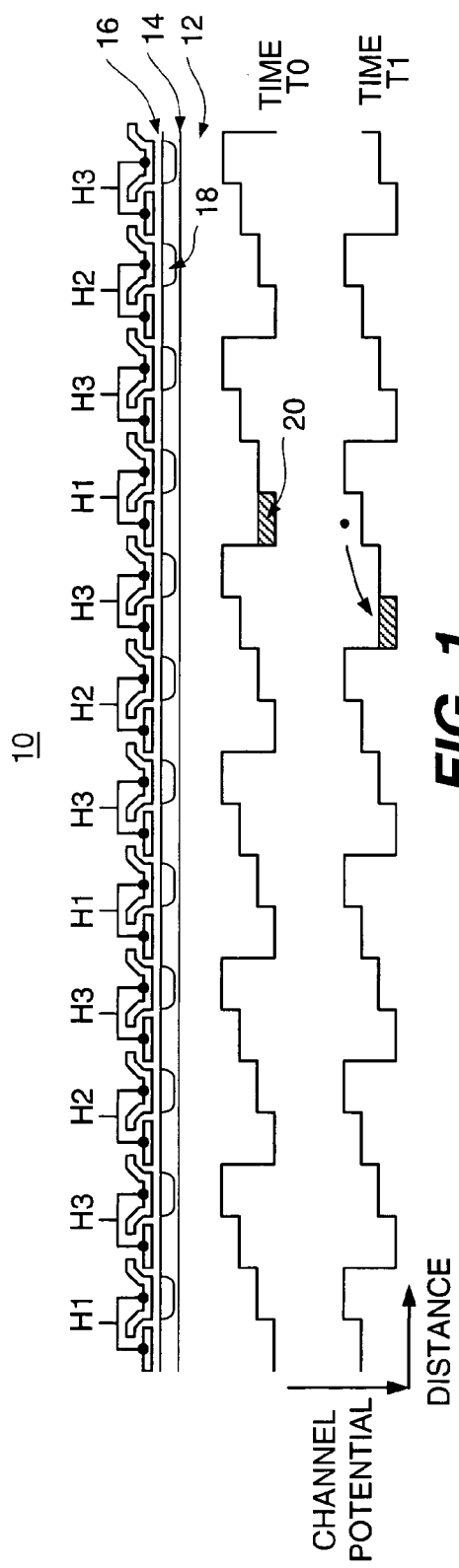
FIG. 1 is a side view in cross section of a prior art CCD.
Figure 2:
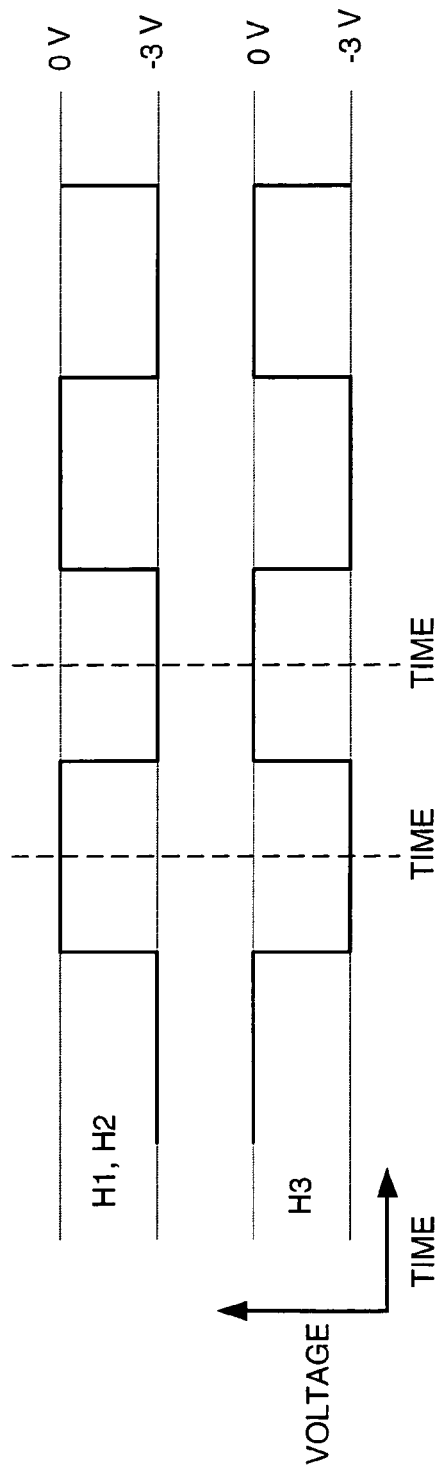
FIG. 2 is a clocking diagram for the prior art CCD of FIG. 1.
Figure 3:
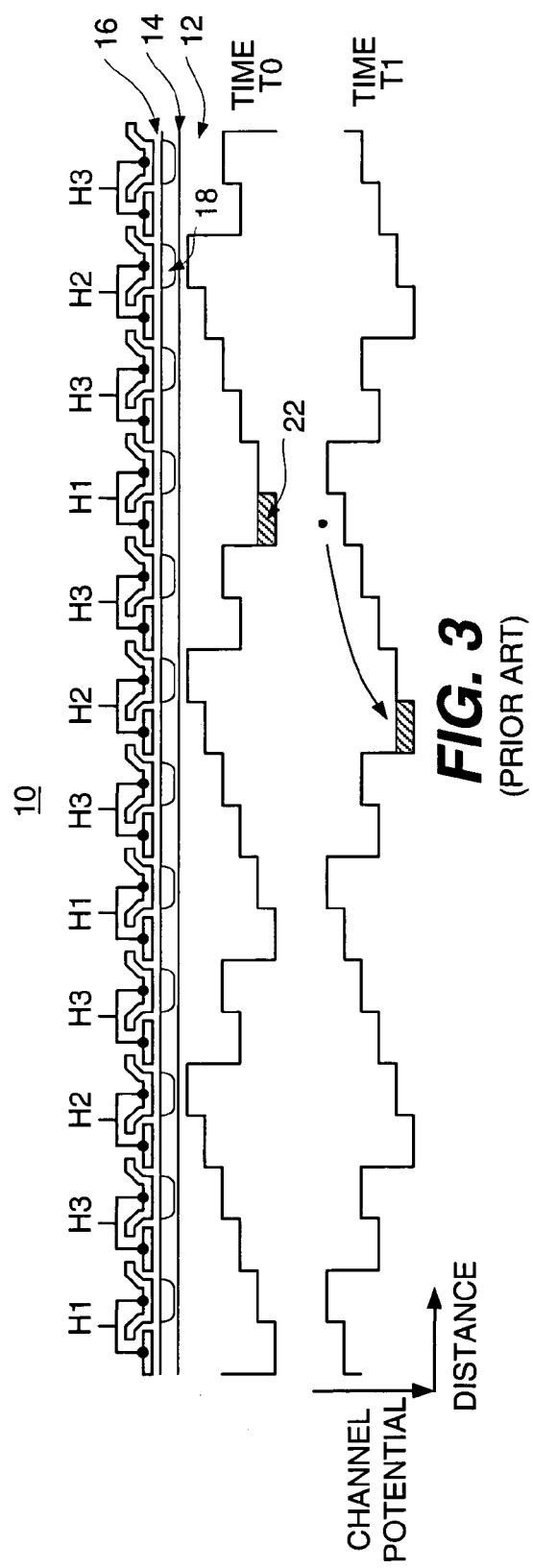
FIG. 3 is a side view in cross section of another prior art CCD.
Figure 4:
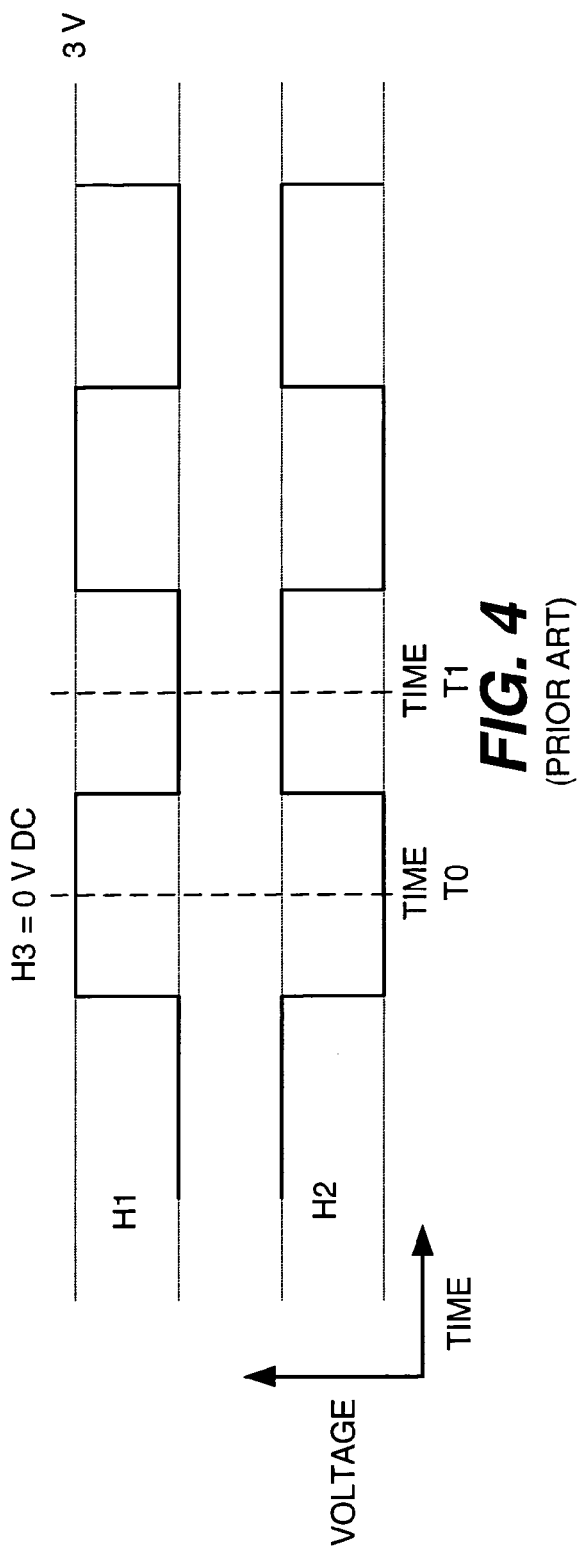
FIG. 4 is a clocking diagram for the prior art CCD of FIG. 3.
Figure 5:
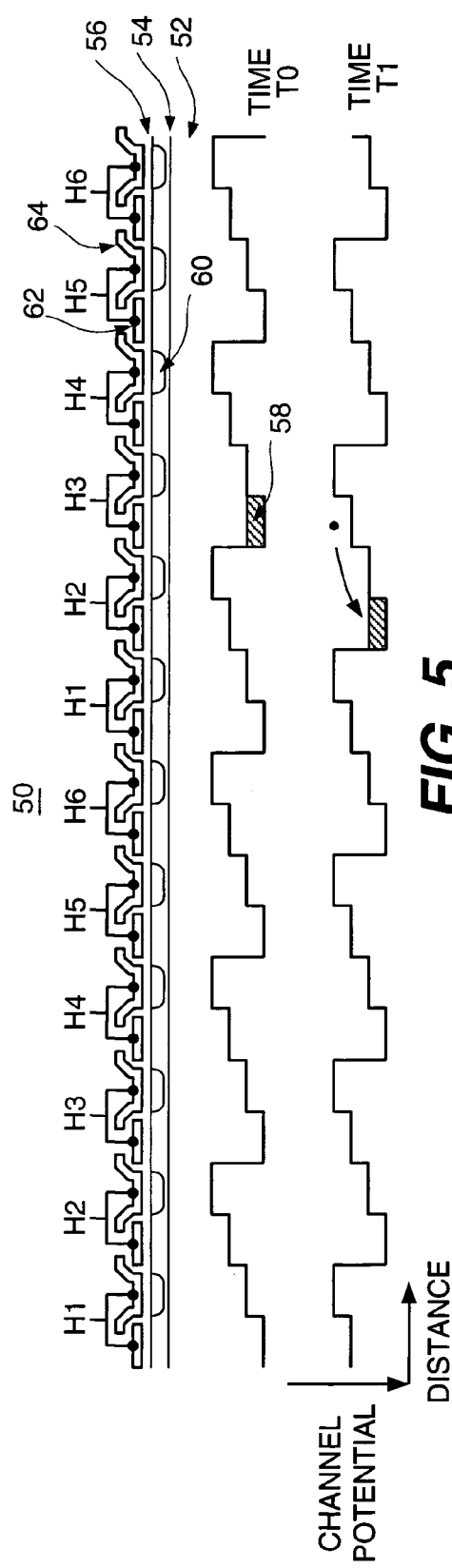
FIG. 5 is a side view in cross section of the CCD of the present invention.

First, the preferred embodiment of the invention is described. Referring to FIG. 5, there is shown a CCD 50 that may be a linear CCD, an area array CCD, vertical or horizontal CCD. The CCD 50 is fabricated on a p-type well or substrate 52. If it is a well, then it might be a p-type well in an n-type substrate, a common configuration for interline type CCD arrays. It also might be the substrate itself if it is a p-type substrate, the common configuration for full frame or linear type CCD arrays. In the well or substrate 52, there is an n-type buried channel 54 which forms the charge packet 58 carrying layer. The buried channel 54 contains a channel adjustment implant 60 to alter the channel potential under the gates or a portion of the gates H1 through H6. The gates are separated from the buried channel 54 by an electrically insulating gate dielectric 56. The CCD 50 is shown with two gate levels 62 and 64 per gate phase H5. The use of only one gate level with a channel potential adjustment implant 60 under a portion of the gate level would be considered by those skilled in the art as equivalent. Other channel potential adjustment means such as gate dielectric thickness changes would also be considered equivalent.

Figure 6:
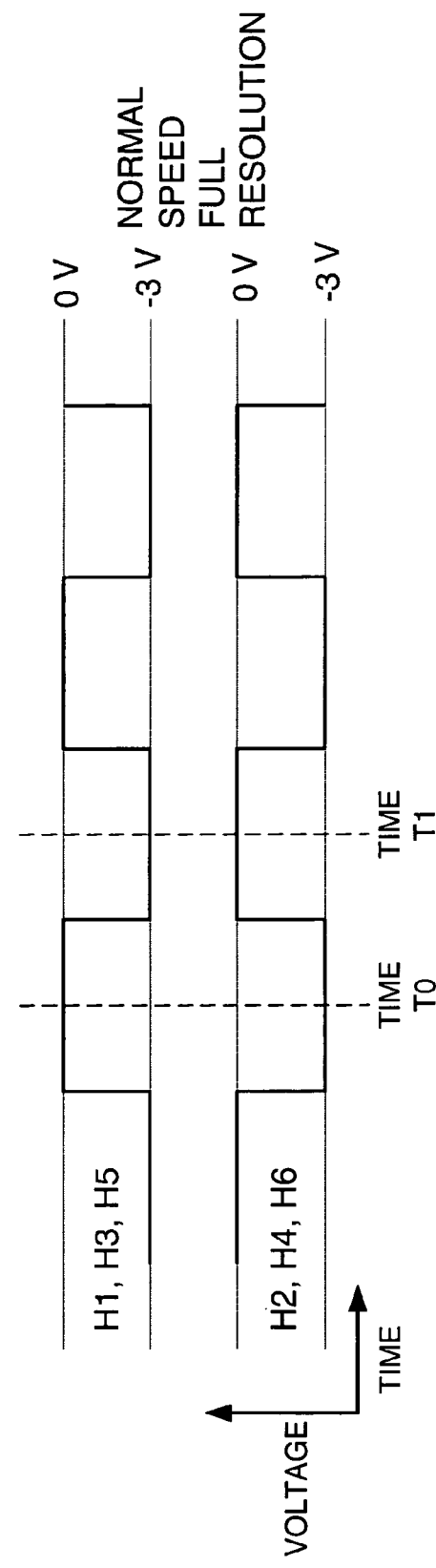
FIG. 6 is a clocking diagram for the CCD of FIG. 5.

The gates in FIG. 5 are connected to six control signals H1 through H6. The pattern of gates H1 through H6 is repeated every six gates. The CCD 50 is capable of operating in two modes. In the first mode the gates H1 through H6 receive applied voltages as shown in FIG. 6. Gates H1, H3, and H5 are clocked complimentary to gates H2, H4, and H6. Equivalently, when the gate voltages of the first mode in FIG. 6 are applied to the CCD 50, alternating gates receive complimentary clock signals.

For the purposes of this discussion complimentary is defined as when one clock is increasing its voltage while the other clock is decreasing its voltage. One clock may finish or start its transition before the other clock as long as for at least some portion of time they are both changing voltage at the same time.

In this first mode, the charge packet 58 is transferred through a distance equal to the length of one gate. This mode would be for full resolution 1× speed image readout.

Figure 7:
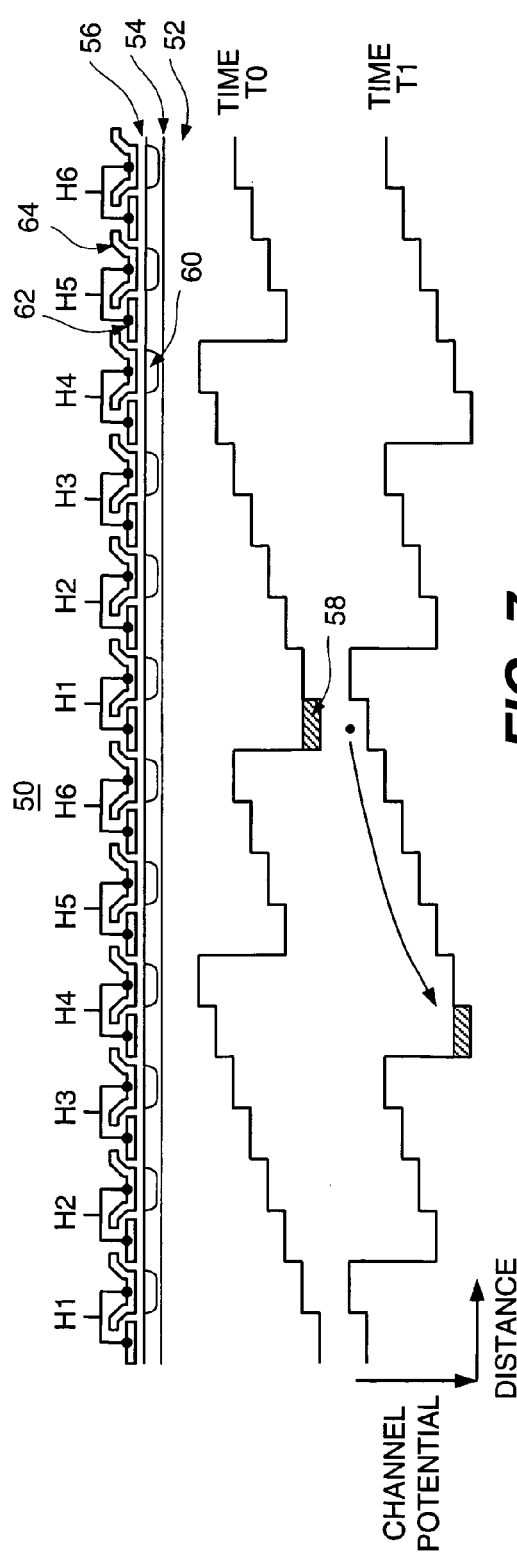
FIG. 7 illustrates FIG. 5 in another charge transfer rate.
Figure 8:
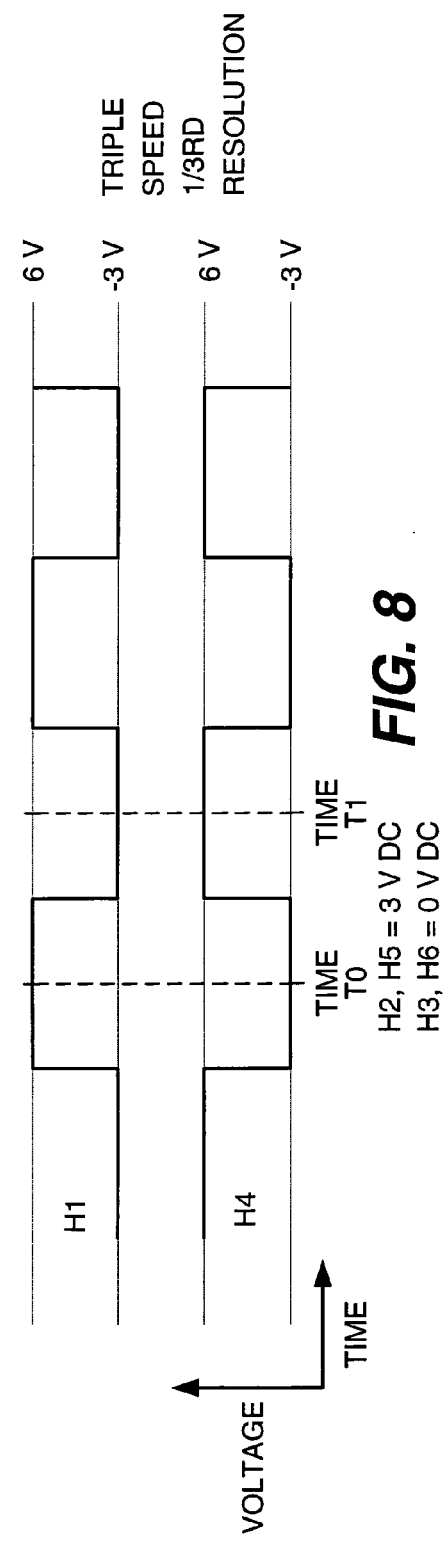
FIG. 8 is a clocking diagram for FIG. 7.

In a second mode, the CCD 50 is clocked with the gate voltages shown in FIG. 8. Now two gates H2 and H5 are held at a first constant voltage, and gates H3 and H6 are held at a second constant voltage. The two remaining gates H1 and H4 are clocked with complimentary voltages. The effect of this new clocking is shown in FIG. 7. The charge packet 58 is transferred across a distance equal to the length of 3 gates from time step T0 to time step T1. The first and second constant voltages on the gates between H1 and H4 are set so as to provide an increasing channel potential with distance.

The advantage of these two modes is to allow the CCD 50 to operate in either a 1× speed full resolution mode or a 3× speed $\frac{1}{3}^{rd}$ resolution mode by simply altering the applied clock voltages and timing. In the 3× speed mode, the clock voltage amplitudes are generally three times or more larger than in 1× speed mode.

Figure 9:
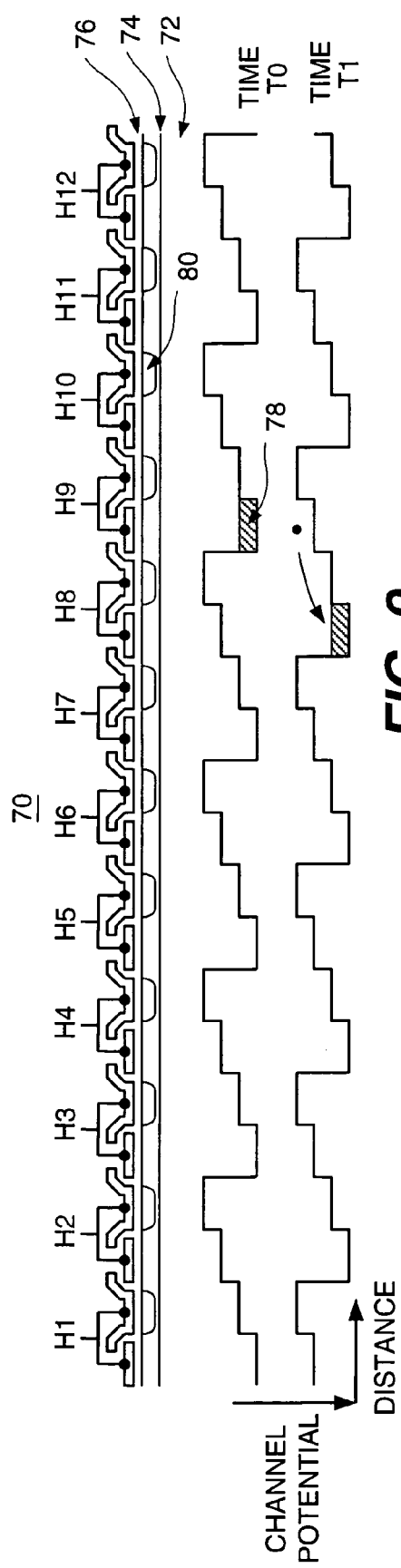
FIG. 9 is an alternative embodiment of the present invention.

Now, an alternative embodiment of the invention is described. Referring to FIG. 9, the CCD 70 is fabricated on a p-type well or substrate 72. In the well or substrate 72, there is an n-type buried channel 74 which forms the charge packet 78 carrying layer. The buried channel 74 contains a channel adjustment implant 80 to alter the channel potential under the gates or a portion of the gates H1 through H12. The gates are separated from the buried channel 74 by an electrically insulating gate dielectric 76. The gate pattern H1 through H12 is repeated every 12 gates throughout the length of the CCD 70.

Figure 10:
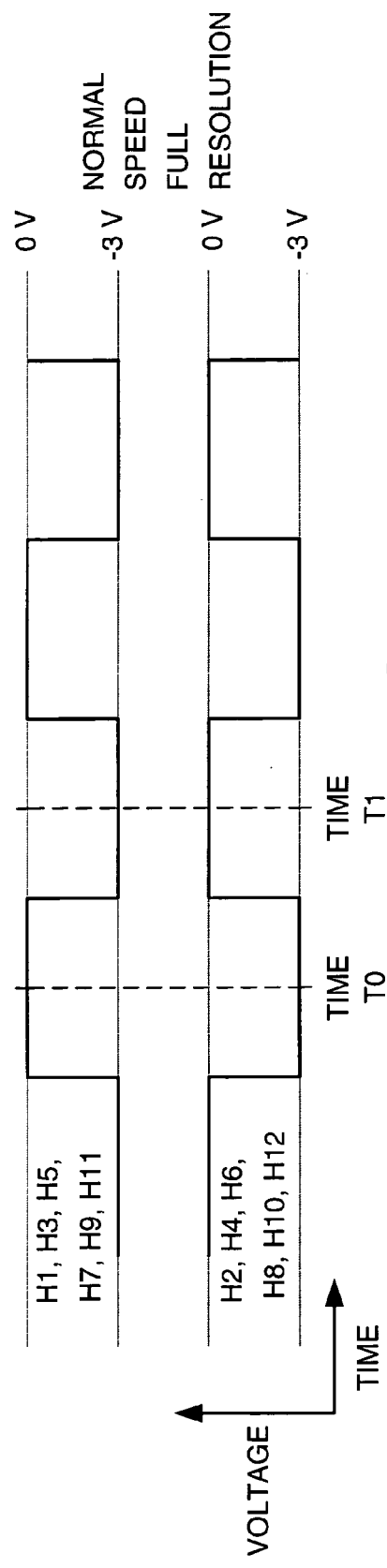
FIG. 10 is a clocking diagram for FIG. 9.

In this alternative embodiment, the CCD 70 may be operated in three modes. The first mode is 1× speed full resolution, the second mode is a 2× speed half-resolution mode, and the third mode is a 3× speed $\frac{1}{3}^{rd}$ resolution mode. In the first mode, the gate voltages are shown in FIG. 10. Gates H1, H3, H5, H7, H9, and H11 are clocked complimentary to gates H2, H4, H6, H8, H10, and H12. Equivalent wording is alternating gates are clocked complimentary to each other. The result of this first mode clocking is shown in FIG. 9 where the charge packet 78 is transferred a distance equal to the length of one gate from time step T0 to time step T1.

Figure 11:
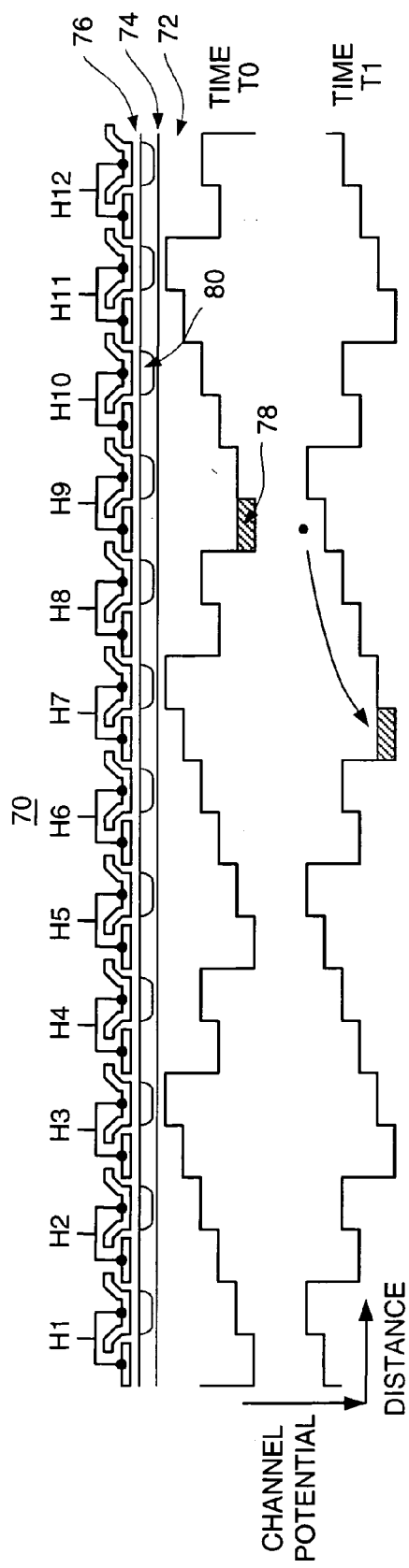
FIG. 11 illustrates FIG. 9 in another charge transfer rate.
Figure 12:
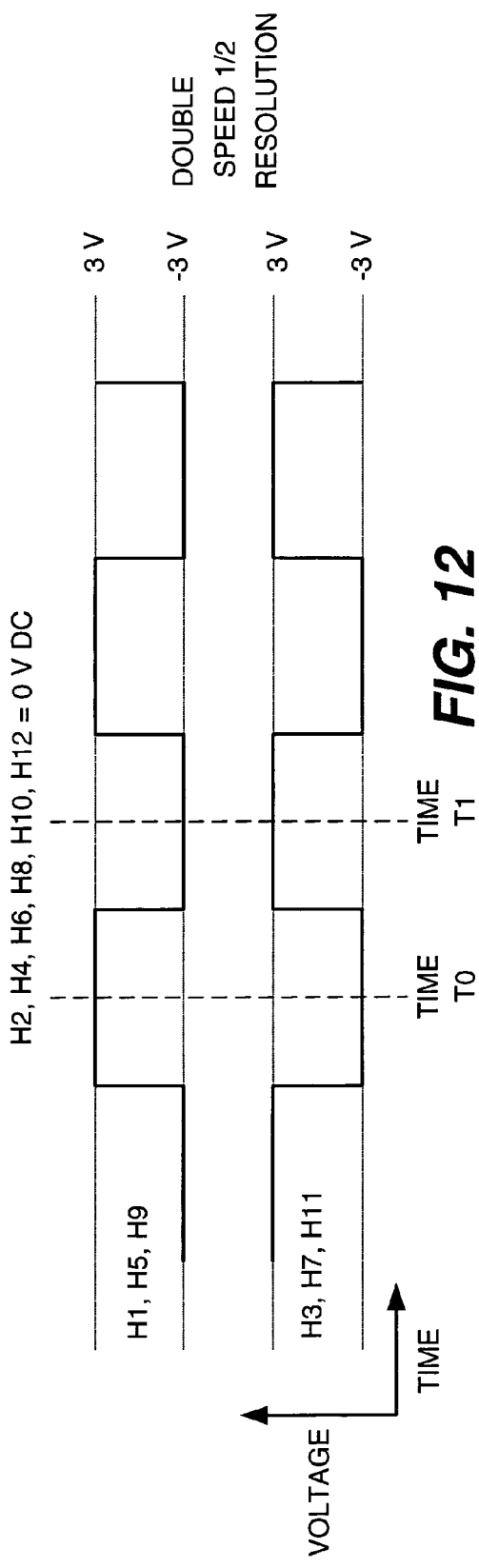
FIG. 12 is a clocking diagram for FIG. 11.

In the second mode the gate voltages are shown in FIG. 12. Gates H1, H5, and H9 are clocked complimentary to gates H3, H7, and H11. Gates H2, H4, H6, H8, H10, and H12 are held at a constant voltage approximately halfway between the high and low clocked voltages. The amplitude of the clocked voltages in the second mode is two or more times larger than the amplitude of the clocked voltages in the first mode. The result of the second mode clocking is shown in FIG. 11. The charge packet 78 is transferred a distance equal to the length of two gates from time step T0 to time step T1.

Figure 13:
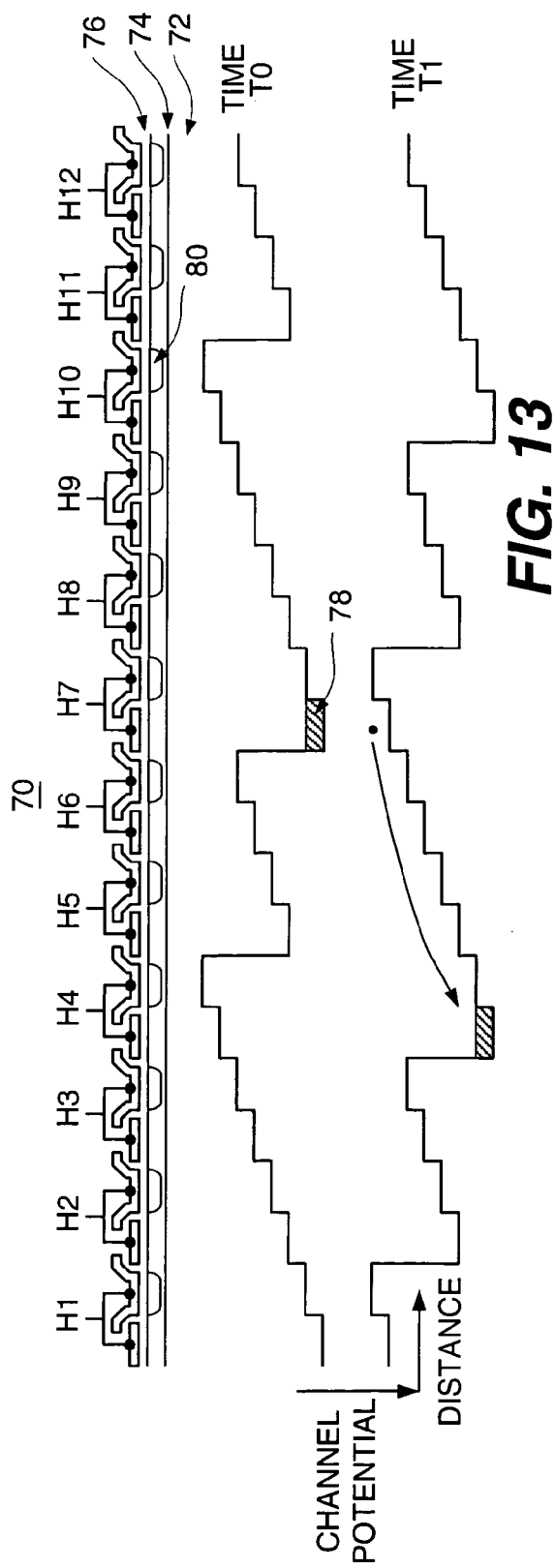
FIG. 13 illustrates FIG. 8 in still another charge transfer rate.
Figure 14:
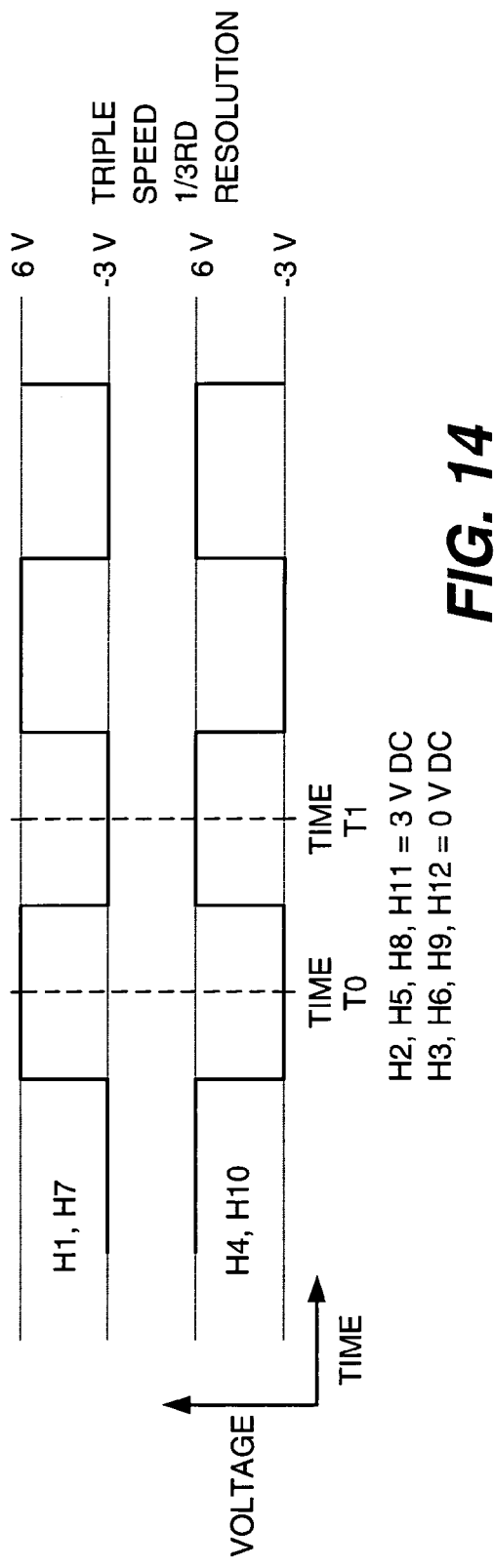
FIG. 14 is a clocking diagram for FIG. 13.

In the third mode the gate voltages are shown in FIG. 14. Gates H1 and H7 are clocked complimentary to gates H4 and H10. Gates H2, H5, H8, and H11 are held at a first constant voltage and gates H3, H6, H9, and H12 are held at a second constant voltage. The first and second constant voltages on the gates are set so as to provide an increasing channel potential with distance. The amplitude of the clocked voltages in the third mode are three or more times larger than the amplitude of the clocked voltages in the first mode. The result of the second mode clocking is shown in FIG. 13. The charge packet 78 is transferred a distance equal to the length of three gates from time step T0 to time step T1.

Figure 15:
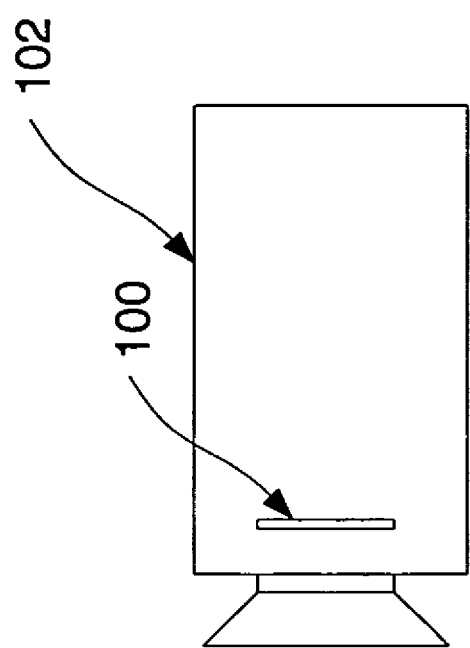
FIG. 15 is a camera for illustrating a typical commercial embodiment of the CCD of the present invention.

FIG. 15 shows a camera 102 containing one or more image sensors 100 of either the first or second embodiment described herein. The camera 102 contains a means of switching between the various modes of operation.

The invention has been described with reference to a preferred embodiment. However, it will be appreciated that variations and modifications can be effected by a person of ordinary skill in the art without departing from the scope of the invention. For example, the particular phase architecture such as a true 2-phase architecture or the like would not alter the function of the present invention.

PARTS LIST

10 CCD
12 p-type well or substrate
14 n-type buried channel
16 electrically insulating gate dielectric
18 channel adjustment implant
20 charge packet
22 charge packet
50 CCD
52 p-type well or substrate
54 n-type buried channel
56 electrically insulating gate dielectric
58 charge packet
60 channel adjustment implant
62 gate level
64 gate level
70 CCD
72 p-type well or substrate
74 n-type buried channel
76 electrically insulating gate dielectric
78 charge packet
80 channel adjustment implant
100 image sensor
102 camera
H1–H12 gates/control signals
T0 time step
T1 time step

What is claimed is:

1. A charge-coupled device comprising:
    (a) a substrate or well of a first conductivity type;
    (b) a buried channel of a second conductivity type;
    (c) a dielectric disposed on the substrate; and
    (d) six gates disposed on the dielectric that are spatially oriented sequentially 1 through 6 in which six gates, in a first mode, receives signals in which alternating gates receive substantially complimentary clock cycles, and in a second mode the gates receive signals in which gates 1 and 4 receive complimentary clock cycles and gates 2 and 5 are approximately held at a first constant voltage and gates 3 and 6 are approximately held at a second constant voltage.

2. A charge-coupled device comprising:
(a) a substrate or well of a first conductivity type;
(b) a buried channel of a second conductivity type;
(c) a dielectric disposed on the substrate; and
(d) twelve gates disposed on the dielectric that are space oriented sequentially 1 through 12 in which twelve gates, in a first mode, receive signals in which alternating gates receive substantially complimentary clock cycles; and in a second mode the gates receive signals in which gates 1, 5 and 9 are clocked substantially complimentary to gates 3, 7 and 11 and gates 2, 4, 6, 8, 10 and 12 are approximately held at a first constant voltage; and in a third mode gates 1 and 7 are clocked substantially complimentary to gates 4 and 10 and gates 2, 5, 8 and 11 are approximately held at a second constant voltage and gates 3, 6, 9 and 12 are approximately held at a third constant voltage.

3. The charge-coupled device as in claim 2 wherein the first and second voltages are substantially equal.

4. The charge-coupled device as in claim 2 wherein the first and third voltages are substantially equal.

5. A camera comprising:
a charge-coupled device comprising:
(a) a substrate or well of a first conductivity type;
(b) a buried channel of a second conductivity type;
(c) a dielectric disposed on the substrate; and
(d) six gates disposed on the dielectric that are space oriented sequentially 1 through 6 in which six gates, in a first mode, receives signals in which alternating gates receive substantially complimentary clock cycles, and in a second mode the gates receive signals in which gates 1 and 4 receive complimentary clock cycles and gates 2 and 5 are approximately held at a first constant voltage and gates 3 and 6 are approximately held at a second constant voltage.

6. A camera comprising:
a charge-coupled device comprising:
(a) a substrate or well of a first conductivity type;
(b) a buried channel of a second conductivity type;
(c) a dielectric disposed on the substrate; and
(d) twelve gates disposed on the dielectric that are space oriented sequentially 1 through 12 in which twelve gates, in a first mode, receive signals in which alternating gates receive substantially complimentary clock cycles; and in a second mode the gates receive signals in which gates 1, 5 and 9 are clocked substantially complimentary to gates 3, 7 and 11 and gates 2, 4, 6, 8, 10 and 12 are approximately held at a first constant voltage; and in a third mode, gates 1 and 7 are clocked substantially complimentary to gates 4 and 10 and gates 2, 5, 8 and 11 are approximately held at a second constant voltage and gates 3, 6, 9 and 12 are approximately held at a third constant voltage.

7. The camera as in claim 6 wherein the first and second voltages are substantially equal.

\* \* \* \* \*